(12) United States Patent
Chidambarrao et al.

(10) Patent No.: US 8,445,974 B2
(45) Date of Patent: May 21, 2013

(54) ASYMMETRIC FET INCLUDING SLOPED THRESHOLD VOLTAGE ADJUSTING MATERIAL LAYER AND METHOD OF FABRICATING SAME

(75) Inventors: Dureseti Chidambarrao, Hopewell Junction, NY (US); Sunfei Fang, Hopewell Junction, NY (US); Yue Liang, Hopewell Junction, NY (US); Xiaojun Yu, Hopewell Junction, NY (US); Jun Yuan, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 254 days.

(21) Appl. No.: 12/683,602

(22) Filed: Jan. 7, 2010

(65) Prior Publication Data
US 2011/0163385 A1    Jul. 7, 2011

(51) Int. Cl.
*H01L 21/02* (2006.01)
(52) U.S. Cl.
USPC .......................... 257/411; 257/368; 438/286
(58) Field of Classification Search
USPC ................ 257/302, 315–327, 335, 368, 408, 257/411; 438/264, 275, 286, 299, 302
See application file for complete search history.

(56) References Cited

U.S. PATENT DOCUMENTS

| | | | |
|---|---|---|---|
| 6,015,991 A | 1/2000 | Wheeler et al. | |
| 6,040,220 A | 3/2000 | Gardner et al. | |
| 6,187,657 B1 | 2/2001 | Xiang et al. | |
| 6,630,720 B1 | 10/2003 | Maszara et al. | |
| 6,707,112 B2 * | 3/2004 | Kachelmeier | 257/368 |
| 7,023,055 B2 | 4/2006 | Ieong et al. | |
| 7,329,923 B2 | 2/2008 | Doris et al. | |
| 7,923,321 B2 * | 4/2011 | Lai et al. | 438/230 |
| 2005/0116290 A1 | 6/2005 | de Souza et al. | |
| 2006/0131652 A1 * | 6/2006 | Li | 257/350 |
| 2009/0166747 A1 * | 7/2009 | Niimi et al. | 257/369 |

* cited by examiner

*Primary Examiner* — Kimberly Rizkallah
*Assistant Examiner* — Errol Fernandes
(74) *Attorney, Agent, or Firm* — Scully, Scott, Murphy & Presser, P.C.; H. Daniel Schnurmann

(57) ABSTRACT

A semiconductor structure is provided that includes at least one asymmetric gate stack located on a surface of a semiconductor structure. The at least one asymmetric gate stack includes, from bottom to top, a high k gate dielectric, a sloped threshold voltage adjusting material layer and a gate conductor. A method of forming such a semiconductor structure is also provided in which a line of sight deposition process is used in forming the sloped threshold voltage adjusting material layer in which the deposition is tilted within respect to a horizontal surface of a semiconductor structure.

19 Claims, 2 Drawing Sheets

ASYMMETRIC FET INCLUDING SLOPED THRESHOLD VOLTAGE ADJUSTING MATERIAL LAYER AND METHOD OF FABRICATING SAME

BACKGROUND

The present invention relates to semiconductor structures and methods of fabricating the same. More particularly, the present invention relates to asymmetric field effect transistors (FETs) including at least one gate stack having a sloped threshold voltage adjusting material layer and a method of fabricating such a structure.

One trend in modern integrated circuit manufacture is to produce semiconductor devices, such as field effect transistors (FETs), which are as small as possible. In a typical FET, a source and a drain are formed in an active region of a semiconductor substrate by implanting n-type or p-type impurities in the semiconductor material. Disposed between the source and the drain is a channel (or body) region. Disposed above the body region is a gate electrode. The gate electrode and the body are spaced apart by a gate dielectric layer.

Although the fabrication of smaller transistors allows more transistors to be placed on a single substrate for the formation of relatively large circuit systems in a relatively small die area, this downscaling can result in a number of performance degrading effects. In addition, achieving a desired device dimension is often difficult as device designers are constrained by limitations imposed by various manufacturing techniques. For example, photolithography is often used to pattern a mask layer that is used to determine the size and placement of device components, such as the gate. However, lithographic limits restrict gate formation to a certain minimum length.

Asymmetric FET devices provide some benefits over conventional FET devices including, for example, improved device performance and reduced drain impact ionization. Although asymmetric FET devices provide an improvement over conventional FETs, the scaling of prior art asymmetric FET devices is also restricted since lithography is also used to define the length of the gate.

Accordingly, there exists a need in the art for semiconductor devices, such as asymmetric FETs, that have a reduced scale and improved device performance. In addition, a need exists for fabrication techniques for making those semiconductor devices.

SUMMARY

According to one aspect of the present invention, a semiconductor structure is provided that includes at least one asymmetric gate stack located on a surface of a semiconductor substrate. The at least one asymmetric gate stack includes, from bottom to top, a high k gate dielectric, a sloped threshold voltage adjusting material layer and a gate conductor.

The term "high k gate dielectric" is used throughout the instant application to denote a dielectric material having a dielectric constant greater than silicon oxide. The term "threshold voltage adjusting material layer" denotes a layer that includes at least one material that can move the threshold voltage of the gate stack towards either an nFET band edge or a pFET band edge. The term "sloped" when referring to the threshold voltage adjusting material layer denotes that the material layer has a different thickness from one edge of the material layer to another edge of the material layer. The different thickness within the same threshold voltage adjusting material layer provides a different distribution of threshold voltage adjustment to the gate stack. For example, an edge containing a lower thickness of threshold voltage adjusting material provides less threshold voltage adjustment as compared to another edge of the threshold voltage adjusting material layer having a greater thickness. As such, an asymmetric FET is provided; the asymmetry is within the different distribution of threshold voltage adjustment that can be achieved by the sloped threshold voltage adjusting material layer within the at least one gate stack.

In one embodiment of the invention, a semiconductor structure is provided that includes a semiconductor substrate including a device channel located between a source region and a drain region. At least one gate stack is located atop the device channel. The at least one gate stack includes, from bottom to top, a high k gate dielectric, a sloped threshold voltage adjusting material layer, and a gate conductor. The sloped threshold voltage adjusting material layer provides different threshold voltage adjustment to the at least one gate stack.

In some instances, the semiconductor structure mentioned above also includes another gate stack which is located adjacent to the gate stack described above. The another gate stack includes, from bottom to top, another high k gate dielectric, a non-sloped threshold voltage adjusting material layer and another gate conductor. In one embodiment, the non-sloped threshold voltage material layer is comprised of the same threshold voltage adjusting material as the sloped threshold voltage adjusting material layer of the at least one gate stack. In another embodiment, the non-sloped threshold voltage material layer is comprised of a pFET or an nFET threshold voltage adjusting material and the sloped threshold voltage adjusting material layer of the at least one gate stack is comprised of the other of the pFET or nFET threshold voltage adjusting material not present in the another gate stack.

In yet another embodiment of the present invention, a semiconductor structure is provided that includes a semiconductor substrate including a pFET device region and an nFET device region. Each device region includes a device channel located between a source region and a drain region. This structure further includes at least one pFET gate stack located atop one of the device channels within the pFET device region. The at least one pFET gate stack includes, from bottom to top, a high k gate dielectric, a sloped pFET threshold voltage adjusting material layer, and a gate conductor. The sloped pFET threshold voltage adjusting material layer provides different threshold voltage adjustment to the at least one pFET gate stack. This structure further includes at least one nFET gate stack located atop one of the device channels within the nFET device region. The at least one nFET gate stack includes, from bottom to top, a high k gate dielectric, a sloped nFET threshold voltage adjusting material layer, and a gate conductor. The sloped nFET threshold voltage adjusting material layer provides different threshold voltage adjustment to the at least one nFET gate stack.

In addition to the semiconductor structure mentioned above, the present invention also provides a method of fabricating the same. In one embodiment of the invention, the method includes providing a structure including at least one dummy gate region located on a surface of a semiconductor substrate and a dielectric material layer located on sidewalls of the at least one dummy gate region. A portion of the dummy gate region is removed to expose an underlying high k gate dielectric. A sloped threshold voltage adjusting material layer is formed on an upper surface of the high k gate dielectric. A gate conductor is formed atop the sloped threshold voltage adjusting material layer.

DETAILED DESCRIPTION

Figure 1:
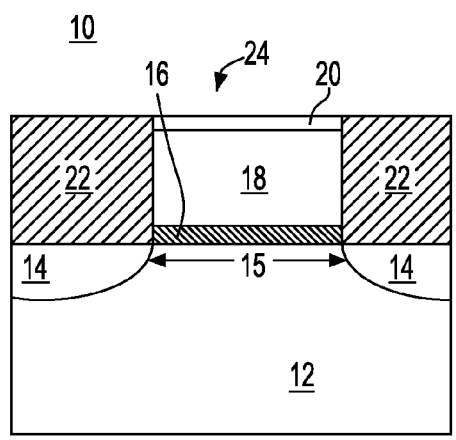
FIG. 1 is a pictorial representation (through a cross sectional view) illustrating an initial structure including a dummy gate region located on a surface of a semiconductor substrate that can be employed in one embodiment of the present invention.

The present invention, which provides asymmetric semiconductor devices and methods of fabricating the same, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the invention may be practiced without these specific details. In other instances, well-known structures or processing steps have not been described in detail in order to avoid obscuring the invention.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Reference is now made to FIGS. 1-4 which are pictorial representations (through cross sectional views) illustrating an asymmetric field effect transistor (FET) during various stages of fabrication in accordance with an embodiment of the present invention. The method of the present invention begins by providing the initial structure 10 shown in FIG. 1. The initial structure 10 includes a dummy gate region 24 that is located on a surface of a semiconductor substrate 12. The dummy gate region 24 shown in FIG. 1 includes at least a high k gate dielectric 16, a dummy gate 18 and an optional hard mask 20. An optional chemox layer (not shown) can be positioned between the high k gate dielectric 16 and the semiconductor substrate 12. A dielectric material layer 22 is located on sidewalls of the dummy gate region 24 and atop exposed portions of the semiconductor substrate 12 that are located at the footprint of the dummy gate region 24.

The initial structure 10 also includes a source region and a drain region, which are collectively referred to herein as source/drain regions 14, located within the semiconductor substrate 12 at the footprint of the dummy gate region 24. The region of the semiconductor substrate 12 between the source/drain regions 14 and located beneath the dummy gate region 24 is the device channel 15. In some embodiments of the present invention, the source/drain regions are raised source/drain regions. The raised source/drain regions are formed utilizing any conventional process well known to those skilled in the art.

In yet other embodiments, the initial structure 10 also includes a metal semiconductor alloy contact (not shown) located atop each of the source/drain regions 14. The metal semiconductor alloy contact is formed utilizing any conventional process that is capable of converting a deposited metal and an underlying semiconductor material to a metal semiconductor alloy. In one embodiment of the invention, a conventional silicide process is employed. In some instances, the silicide process may include a self-aligned silicide process. In the self-aligned silicide process, one edge of the metal semiconductor alloy contact contacts an edge of the dummy gate region 24. The metal used in forming the metal semiconductor alloy contact can include, but is not limited to tantalum, titanium, tungsten, ruthenium, cobalt, nickel, platinum, or any suitable combination of those materials. A diffusion barrier such as titanium nitride or tantalum nitride can be formed atop the metal. An anneal is performed that causes reaction between the metal and the underlying semiconductor material forming metal semiconductor alloy regions. Typically, the anneal is performed at a temperature of at least 250° C. or above. A single anneal step or multiple anneal steps can be used. Any non-reacted metal and the optional diffusion barrier are removed after the anneal has been performed.

The initial structure 10 shown in FIG. 1 can be formed utilizing any conventional replacement gate process. In one embodiment, the dummy gate region 24 is formed prior to forming the dielectric material layer 22. In yet another embodiment, the dielectric material layer 22 is formed first, followed by the dummy gate region 24. The source/drain regions 14 can be processed into the semiconductor substrate 12 before formation of both the dielectric material layer 22 and the dummy gate region 24. Alternatively, the source/drain regions 14 can be formed before the formation of the dielectric material layer 22 but after the formation of the dummy gate region 24. The source/drain regions 14 are formed utilizing any known ion implantation process. An anneal process can follow the ion implantation which activates the dopant atoms implanted within the substrate.

The semiconductor substrate 12 illustrated in FIG. 1 is comprised of any semiconductor material including, but not limited to Si, Ge, SiGe, SiC, SiGeC, GaAs, GaN, InAs, InP and all other III/V or II/VI compound semiconductors. Semiconductor substrate 12 may also comprise an organic semiconductor or a layered semiconductor such as Si/SiGe, a silicon-on-insulator (SOI), a SiGe-on-insulator (SGOI) or a germanium-on-insulator (GOI). In some embodiments of the present invention, it is preferred that the semiconductor substrate 12 is composed of a Si-containing semiconductor material, i.e., a semiconductor material that includes silicon. The semiconductor substrate 12 may be doped, undoped or contain doped and undoped regions therein. The semiconductor substrate 12 may include a single crystal orientation or it may include at least two coplanar surface regions that have different crystal orientations (the latter substrate is referred to in the art as a hybrid substrate). When a hybrid substrate is employed, an nFET is typically formed on a (100) crystal surface, while a pFET is typically formed on a (110) crystal plane. The hybrid substrate can be formed by techniques that are well known in the art. See, for example, U.S. Pat. No. 7,329,923, U.S. Publication No. 2005/0116290, dated Jun. 2, 2005 and U.S. Pat. No. 7,023,055, the entire contents of each are incorporated herein by reference.

The semiconductor substrate 12 may also include a first doped (n- or p-) region, and a second doped (n- or p-) region. For clarity, the doped regions are not specifically shown in any of the drawings of the present application. The first doped region and the second doped region may be the same, or they may have different conductivities and/or doping concentrations. These doped regions are known as "wells" and they are formed utilizing conventional ion implantation processes.

At least one isolation region (not shown) can be formed into the semiconductor substrate 12. The at least one isolation region is typically formed prior to forming either the dielectric material layer 22 or the dummy gate region 24. The isolation region may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process. Note that the at least one isolation region provides isolation between neighboring gate regions, typically required when the neighboring gates have opposite conductivities, i.e., nFETs and pFETs.

As stated above, a chemox layer (not shown) can optionally be positioned between the semiconductor substrate 12 and the high k gate dielectric 16. When present, the optional chemox layer can be formed utilizing a conventional growing technique that is well known to those skilled in the art including, for example, oxidation or oxynitridation. In some embodiments of the invention, the chemox layer can be formed by a wet chemical oxidation process. When the substrate 12 is a Si-containing semiconductor, the chemox layer is comprised of silicon oxide, silicon oxynitride or a nitrided silicon oxide. When the substrate 12 is other than a Si-containing semiconductor, the chemox layer may comprise a semiconducting oxide, a semiconducting oxynitride or a nitrided semiconducting oxide. The thickness of the chemox layer is typically from about 0.5 nm to about 1.2 nm, with a thickness from about 0.8 nm to about 1 nm being more typical. The thickness, however, may be different after processing at higher temperatures, which are usually required during FET or CMOS fabrication.

The high k gate dielectric 16 employed in the present invention within the dummy gate region 24 includes any dielectric metal oxide having a dielectric constant that is greater than the dielectric constant of silicon oxide, e.g., 3.9. Typically, the high k gate dielectric 16 that is employed in the present invention has a dielectric constant greater than 4.0, with a dielectric constant of greater than 8.0 being even more typical. Exemplary high k dielectric materials include, but are not limited to $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Multilayered stacks of these high k materials can also be employed as the high k gate dielectric 16. Each value of x is independently from 0.5 to 3 and each value of y is independently from 0 to 2.

The thickness of the high k gate dielectric 16 may vary depending on the technique used to form the same. Typically, however, the high k gate dielectric 16 has a thickness from 0.5 nm to 10 nm, with a thickness from 1.0 nm to 5 nm being more typical. The high k gate dielectric 16 employed in the invention may have an effective oxide thickness on the order of, or less than, 1 nm.

The high k gate dielectric 16 can be formed by methods well known in the art including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), and other like deposition processes.

Dummy gate 18 of dummy gate region 24 includes any sacrificial material such as a polysilicon and/or a metal that can be selectively removed from the dummy gate region during a subsequent etch process. The dummy gate 18 can be formed utilizing any deposition process including, for example, CVD, plasma enhanced chemical vapor deposition (PECVD), chemical solution deposition and PVD. The thickness of the dummy gate 18 may vary depending on the material of the dummy gate 18 and the technique used in forming the same. Typically, the dummy gate 18 has a thickness from 10 nm to 200 nm, with a thickness from 50 to 150 nm being more typical.

The hard mask 20 that is located atop the dummy gate 20 is optional and is not necessarily employed in all embodiments of the invention. When present, the hard mask 20 is comprised of an oxide, nitride, oxynitride or a multilayered stack including any combination of hard mask materials. In one embodiment, the optional hard mask 20 is comprised of silicon oxide. In another embodiment, the optional hard mask 20 is comprised of silicon nitride. In yet a further embodiment, the optional hard mask 20 is comprised of a stack of silicon oxide and silicon nitride. The optional hard mask 20 can be formed utilizing a conventional thermal growing process such as, for example, thermal oxidation and/or thermal nitridation. In some embodiments, the optional hard mask 20 can be formed by a conventional deposition process including, but not limited to CVD, PECVD, ALD and PVD. The thickness of the optional hard mask 20 may vary depending on the hard mask material employed and the technique used in forming the same. Typically, the optional hard mask 20 has a thickness from 20 nm to 30 nm.

The dielectric material layer 22 of the initial structure 10 shown in FIG. 1 may comprise, for example, a spin-on-glass and/or chemical vapor deposition (CVD) oxide such as undoped silicate glass (USG), borosilicate glass (BSG), phosphosilicate glass (PSG), fluorosilicate glass (FSG), borophosphosilicate glass (BPSG), or a combination thereof. Alternately, the dielectric material layer 22 may comprise a low-k dielectric material having a dielectric constant less than 3.9 (the dielectric constant of silicon oxide), and preferably less than 3.0. Illustrative examples of low-k dielectric materials that can be used as dielectric material layer 22 include, but are not limited to, silsesquioxanes, C doped oxides (i.e., organosilicates) that include atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like.

The dielectric material layer 22 can be formed by any deposition process that is well known to those skilled in the art including, but not limited to spin-on coating, CVD, PECVD, evaporation and chemical solution deposition. When the dielectric material layer 22 is formed prior to forming the dummy gate region 24, a dummy gate opening can be formed into a blanket deposited layer of dielectric material layer 22 by lithography and etching and then the materials of the dummy gate region 24 can be formed within the opening. In embodiments when the dielectric material layer 22 is formed after the dummy gate region, the dielectric material layer 22 is deposited after dummy gate region 24 formation and then a planarization process such as chemical mechanical planarization can be employed to provide the initial structure 10 shown in FIG. 1. It is observed that the upper surface of the dielectric material layer 22 is co-planar to the uppermost layer of the dummy gate region 24.

Figure 2:
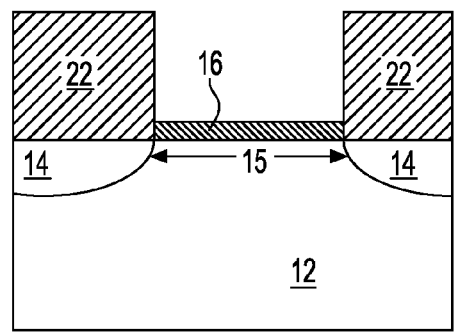
FIG. 2 is a pictorial representation (through a cross sectional view) illustrating the structure of FIG. 1 after removing a portion of the dummy gate region exposing an underlying high k gate dielectric.

Referring to FIG. 2, there is shown the structure of FIG. 1 after removing the optional hard mask 20 and the dummy gate 18 from the dummy gate region 24 exposing the underlying high k gate dielectric 16. The removal of the optional hard mask 20 and the dummy gate 18 can be performed utilizing any etching process that selectively removes the optional hard mask 20 and the dummy gate 18. The etch used in removing optional hard mask 20 and dummy gate 18 can include a dry etch process, a wet etch process or any combination thereof. When a dry etch is employed, one of reactive ion etching, ion beam etching, plasma etching and laser ablation can be employed. When a wet etch process is employed, any chemical etchant or combinations thereof can be used to remove the optional hard mask 20 and the dummy gate 18 from the structure. Examples of chemical etchants that can be used include, but are not limited to TMAH. Notwithstanding the type of wet etch process employed, the etch process stops atop an upper surface of the high k gate dielectric 16.

In some embodiments not shown, the dummy gate region 24 includes a sacrificial gate dielectric such as silicon oxide instead of the high k gate dielectric 16. In such an embodiment, the etch process can be used to also remove the sacrificial gate dielectric and thereafter the high k gate dielectric 16 can be formed utilizing one of the deposition process mentioned above.

Figure 3:
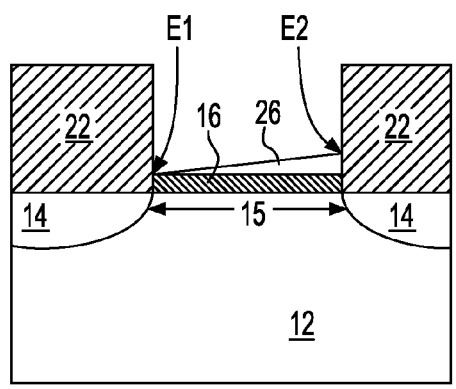
FIG. 3 is a pictorial presentation (through a cross sectional view) illustrating the structure of FIG. 2 after forming a sloped threshold voltage adjusting material layer on an upper surface of the exposed high k gate dielectric.

Referring to FIG. 3, there is illustrated the structure that is formed after forming a sloped threshold voltage adjusting material layer 26 on an exposed upper surface of the high k gate dielectric 16. The term "sloped" when referring to the threshold voltage adjusting material layer denotes that the threshold voltage adjusting material layer has a different thickness from one edge (E1) of the material layer to another edge (E2) of the material layer; the edges (E1 and E2) of layer 26 are defined by the width of the dummy gate region 24 and are located within the opening created after removing portions of the dummy gate region 24. The sloped threshold voltage adjusting material layer 26 provides a different distribution of threshold voltage adjustment within a single threshold voltage adjusting material layer. The different threshold voltage adjustment thus provides an asymmetric FET.

The term "threshold voltage adjusting material" as used throughout the instant application denotes a material that moves the threshold voltage of a gate stack towards either the nFET or pFET band edge. The threshold voltage adjusting material employed as layer 26 may include an nFET threshold voltage adjusting material or a pFET threshold voltage adjusting material. The type of threshold voltage adjusting material employed as the sloped threshold voltage adjusting material layer 26 is dependent on which conductivity type device, e.g., nFET or pFET, is being fabricated.

One example of an nFET threshold voltage adjusting material that can be used in the present invention as layer 26 is a rare earth metal-containing material that comprises an oxide or nitride of at least one element from Group IIIB of the Periodic Table of Elements (CAS version) including, for example, La, Ce, Pr, Nd, Pm, Sm, Eu, Ga, Tb, Dy, Ho, Er, Tm, Yb, Lu or mixtures thereof. Preferably, the rare earth metal-containing material comprises an oxide of La, Ce, Y, Sm, Er and/or Tb, with $La_2O_3$ or LaN being more preferred.

Another example of an nFET threshold voltage adjusting material that can be used in the present invention as layer 26 is an alkaline earth metal-containing material that comprises a compound having the formula $MA_X$ wherein M is an alkaline earth metal (Be, Mg, Ca, Sr, and/or Ba), A is one of O, S and a halide, and x is 1 or 2. It is noted that the present invention contemplates alkaline earth metal-containing compounds that include a mixture of alkaline earth metals and/or a mixture of anions, such as an oxychloride. Examples of alkaline earth metal-containing compounds that can be used in the present invention include, but are not limited to MgO, MgS, $MgF_2$, $MgCl_2$, $MgBr_2$, $MgI_2$, CaO, CaS, $CaF_2$, $CaCl_2$, $CaBr_2$, $CaI_2$, SrO, SrS, $SrF_2$, $SrCl_2$, $SrBr_2$, $SrI_2$, BaO, BaS, $BaF_2$, $BaCl_2$, $BaBr_2$, and $BaI_2$. In one preferred embodiment of the present invention, the alkaline earth metal-containing compound includes Mg. MgO is a highly preferred alkaline earth metal-containing material employed some embodiments of the present invention.

In addition to nFET threshold voltage adjusting materials, the threshold voltage adjusting material can alternatively be a pFET threshold voltage adjusting material. Examples of pFET threshold voltage adjusting materials that can be employed as the sloped threshold voltage adjusting material layer 26 include Al (and its compounds that are non-conductive such as, for example $Al_2O_3$), Ge (and its compounds that are non-conductive such as, for example $GeO_2$), and non-conductive compounds of Ti and Ta such as, $TiO_2$ and $Ta_2O_5$ respectively.

Notwithstanding the type of threshold voltage adjusting material used as layer 26, the sloped threshold voltage adjusting material layer 26 is formed utilizing a line of sight deposition process including, but not limited to sputtering, molecular beam epitaxy, physical vapor deposition (PVD), and electron-beam enhanced deposition. The deposition process employed in forming the sloped threshold voltage adjusting material layer 26 is tilted with respect to the horizontal surface of the substrate 12. The angle of the tilt used during the deposition varies depending on the height of the dielectric material layer 22. Typically, the angle of tilt of the deposition is from 15° up to, but not including, 90°. More typically, the angle of tilt of the deposition is from 30° up to 50°.

The sloped threshold voltage adjusting layer 26 has a first thickness at one edge (E1) of the material layer that increases to a second thickness at another edge (E2) of the material layer. Typically, the thickness of material layer 26 at E1 is a value from 0 up to 1 nm, while the thickness of material layer 26 at E2 is a value from 0.5 nm to 1.5 nm.

Figure 4:
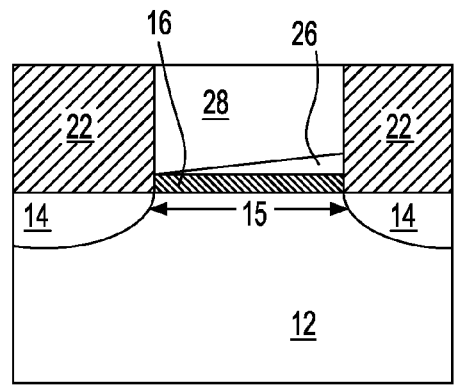
FIG. 4 is a pictorial representation (through a cross sectional view) illustrating the structure of FIG. 3 after forming a gate conductor atop the sloped threshold voltage adjusting material layer.

Referring now to FIG. 4, there is shown the structure of FIG. 3 after forming a gate conductor 28 atop the sloped threshold voltage adjusting material layer 26. The gate conductor 28 comprises any conductive material including, but not limited to polycrystalline silicon, polycrystalline silicon germanium, an elemental metal, (e.g., tungsten, titanium, tantalum, aluminum, nickel, ruthenium, palladium and platinum), an alloy of at least one elemental metal, an elemental metal nitride (e.g., tungsten nitride, aluminum nitride, and titanium nitride), an elemental metal silicide (e.g., tungsten silicide, nickel silicide, and titanium silicide) and multilayers thereof. In one embodiment, the gate conductor 28 is comprised of nFET metal. In another embodiment, the gate conductor is comprised of a pFET metal. In yet a further embodiment, the gate conductor 28 is comprised of polycrystalline silicon.

The gate conductor 28 can be formed utilizing a conventional deposition process including, for example, chemical vapor deposition (CVD), plasma enhanced chemical vapor deposition (PECVD), evaporation, physical vapor deposition (PVD), sputtering, chemical solution deposition, atomic layer deposition (ALD) and other like deposition processes. When Si-containing materials are used as the gate conductor 28, the Si-containing materials can be doped within an appropriate impurity by utilizing either an in-situ doping deposition process or by utilizing deposition, followed by a step such as ion implantation or gas phase doping in which the appropriate impurity is introduced into the Si-containing material. When a metal silicide is formed, a conventional silicidation process is employed.

Figure 5:
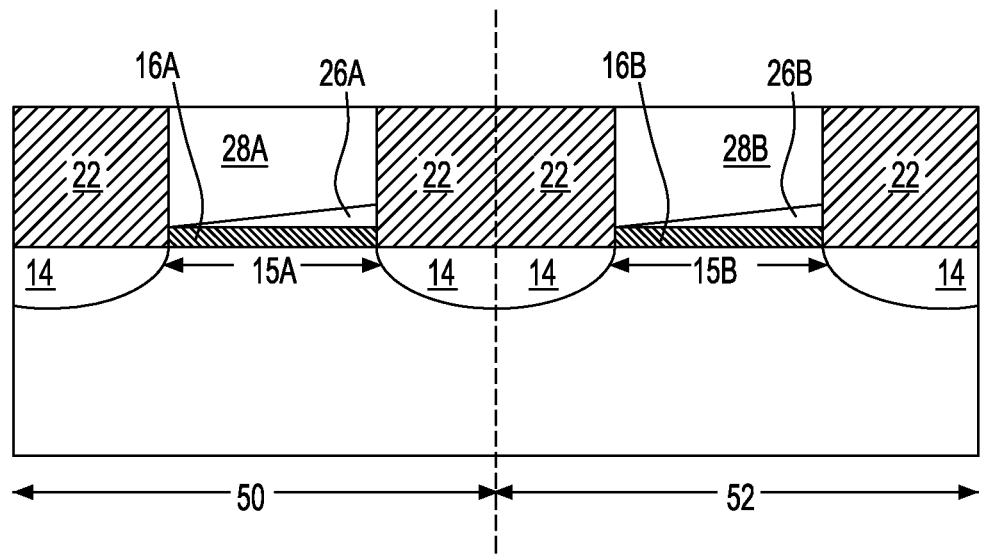
FIG. 5 is a pictorial representation (through a cross sectional view) illustrating a complementary metal oxide semiconductor (CMOS) structure including a pFET including a sloped pFET threshold voltage adjusting material layer and an nFET including a sloped nFET threshold voltage adjusting material that can be formed utilizing the basic processing steps shown in FIGS. 1-4.

Reference is now made to FIG. 5 in which a structure is formed including an nFET device region 50 and a pFET device region 52. The vertical dotted line in FIG. 5 denotes an area of the structure in which an isolation region would be present so as to electrically isolate the different device regions from each other. Within the nFET device region 50, a sloped nFET threshold voltage adjusting material layer 26A is located between a high k gate dielectric 16A and a gate conductor 38A. Within the pFET device region 52, a sloped pFET threshold voltage adjusting material layer 26B is located between a high k gate dielectric 16B and a gate conductor 38B. The high k gate dielectrics 16A and 16B can be comprised of the same or different high k dielectrics. Likewise, the gate conductors 38A and 38B can be comprised of the same or different gate conductor material. The structure shown in FIG. 5 is formed utilizing the same basic processing steps as illustrated within FIGS. 1-4 together with block mask technology that can be used to provide at least the different sloped threshold voltage materials within the different regions of the structure.

Figure 6:
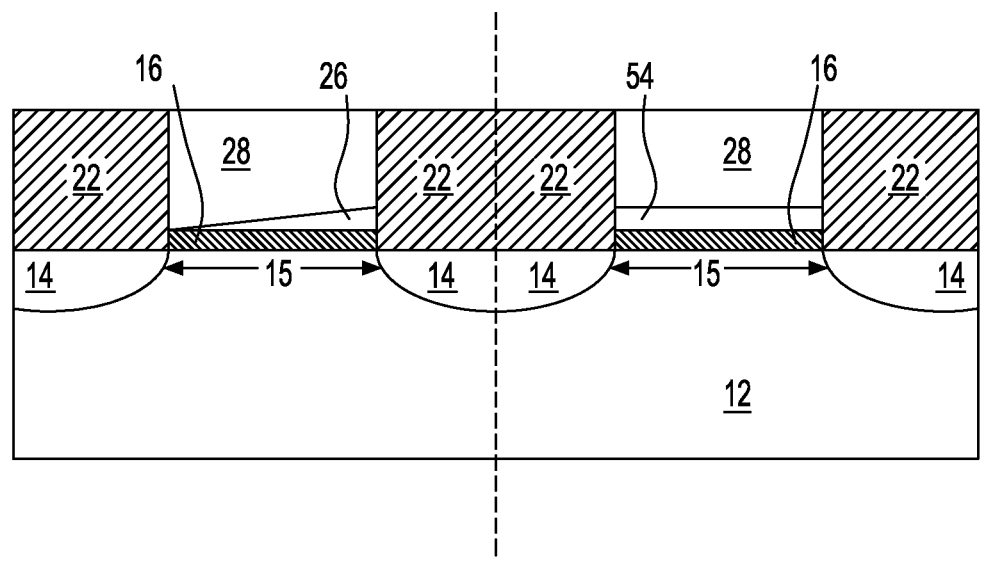
FIG. 6 is a pictorial representation (through a cross sectional view) depicting the structure of FIG. 4 integrated with a FET including a non-sloped threshold voltage adjusting material layer.

Reference is now made to FIG. 6 which illustrates the structure of FIG. 4 together with a FET including a non-sloped, i.e., continuous thickness, threshold voltage adjusting material layer 54. The dotted line in FIG. 6 also indicates an area of the structure in which an isolation region may be present. This structure is formed utilizing the basic steps mentioned within FIGS. 1-4 together with block mask technology. The non-sloped threshold voltage material layer 54, which may be the same or different material as sloped threshold voltage adjusting material layer 26, is formed utilizing a conventional deposition process including, but not limited to, chemical vapor deposition, plasma enhanced chemical vapor deposition, and physical vapor deposition.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising:
a semiconductor substrate including a device channel located between a source region and a drain region;
at least one gate stack located atop the device channel, said at least one gate stack comprising, from bottom to top, a high k gate dielectric having a planar upper surface and a uniform thickness extending atop the entirety of the device channel, a sloped threshold voltage adjusting material layer located on said planar upper surface of the high k gate dielectric, and a gate conductor located atop an upper surface of the sloped threshold voltage adjusting material layer, wherein said sloped threshold voltage adjusting material layer provides different threshold voltage adjustment to said at least one gate stack; and
a dielectric material layer located on each side of the at least one gate stack, said dielectric material layer is in direct physical contact with a sidewall of the at least one gate stack and extends across the entirety of the source region and the drain region, said dielectric material having an uppermost surface that is coplanar with an uppermost surface of said at least one gate stack.

2. The semiconductor structure of claim 1 wherein said high k gate dielectric is selected from $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, an alloy thereof and multilayered stacks thereof, wherein each value of x is independently from 0.5 to 3 and each value of y is independently from 0 to 2.

3. The semiconductor structure of claim 1 wherein said sloped threshold voltage adjusting material layer is a pFET threshold voltage adjusting material selected from Al, $Al_2O_3$, Ge, $GeO_2$, a non-conductive compound of Ti and a non-conductive compound of Ta.

4. The semiconductor structure of claim 1 wherein said sloped threshold voltage adjusting material layer includes an nFET threshold voltage adjusting material selected from a rare earth metal-containing material and an alkaline earth metal-containing material.

5. The semiconductor structure of claim 4 wherein said rare earth metal-containing material is selected from the group consisting of an oxide of at least one element from Group IIIB of the Periodic Table of Elements and a nitride of at least one element from Group IIIB of the Periodic Table of Elements.

6. The semiconductor structure of claim 4 wherein said alkaline earth metal-containing material is comprised of a compound of the formula $MA_x$ wherein M is an alkaline earth metal, A is one of O, S and a halide, and x is 1 or 2.

7. The semiconductor structure of claim 1 further comprising another gate stack located adjacent said at least one gate stack, said another gate stack comprising, from bottom to top, another high k gate dielectric, a non-sloped threshold voltage adjusting material layer and another gate conductor, wherein said non-sloped threshold voltage material layer is comprised of the same threshold voltage adjusting material as the sloped threshold voltage adjusting material layer of the at least one gate stack.

8. The semiconductor structure of claim 1 further comprising another gate stack located adjacent said at least one gate stack, said another gate stack comprising, from bottom to top, another high k gate dielectric, a non-sloped threshold voltage adjusting material layer and another gate conductor, wherein said non-sloped threshold voltage material layer is comprised of a pFET or an nFET threshold voltage adjusting material and the sloped threshold voltage adjusting material layer of the at least one gate stack is comprised of the other of the pFET or nFET threshold voltage adjusting material not present in the another gate stack.

9. The semiconductor structure of claim 1 wherein said dielectric material layer is selected from the group consisting of undoped silicate glass (USG), borosilicate glass (BSG), phosphosilicate glass (PSG), fluorosilicate glass (FSG), borophosphosilicate glass (BPSG), and combinations thereof.

10. The semiconductor structure of claim 1 wherein said dielectric material layer is selected from the group consisting of a silsesquioxane, a C doped oxide that includes atoms of Si, C, O and H, a thermosetting polyarylene ether, and multilayers thereof.

11. The semiconductor structure of claim 1 wherein said sloped threshold voltage adjusting material layer is an nFET threshold voltage adjusting material selected from $La_2O_3$ and LaN.

12. The semiconductor structure of claim 1 wherein an uppermost surface of said sloped pFET threshold voltage adjusting material layer at one edge is in direct physical contact the upper surface of said high k gate dielectric.

13. A semiconductor structure comprising:
  a semiconductor substrate including a pFET device region and an nFET device region, each device region including a device channel located between a source region and a drain region;
  at least one pFET gate stack located atop one of the device channels within the pFET device region, said at least one pFET gate stack comprising, from bottom to top, a high k gate dielectric having a planar upper surface and a uniform thickness extending atop the entirety of the device channel, a sloped pFET threshold voltage adjusting material layer located on said planar upper surface of the high k gate dielectric of the at least one pFET gate stack, and a gate conductor located atop the sloped pFET threshold voltage adjusting material, wherein said sloped pFET threshold voltage adjusting material layer provides different threshold voltage adjustment to said at least one pFET gate stack;
  at least one nFET gate stack located atop one of the device channels within the nFET device region, said at least one nFET gate stack comprising, from bottom to top, a high k gate dielectric having a planar upper surface and uniform thickness extending atop the entirety of the device channel, a sloped nFET threshold voltage adjusting material layer located atop the upper surface of the high k gate dielectric of the at least one nFET gate stack, and a gate conductor located atop the sloped nFET threshold voltage adjusting material layer, wherein said sloped nFET threshold voltage adjusting material layer provides different threshold voltage adjustment to said at least one nFET gate stack; and
  a dielectric material layer located on each side of the at least one nFET gate stack and the at least one pFET gate stack, wherein said dielectric material layer is in direct physical contact with a sidewall of the at least one nFET and the at least one pFET and extends across the entirety of each source region and each drain region, said dielectric material having an uppermost surface that is coplanar with an uppermost surface of said at least one nFET gate stack and said at least one pFET gate stack.

14. The semiconductor structure of claim 13 wherein said sloped pFET threshold voltage adjusting material layer is selected from Al, $Al_2O_3$, Ge, $GeO_2$, a non-conductive compound of Ti and a non-conductive compound of Ta.

15. The semiconductor structure of claim 13 wherein said sloped nFET threshold voltage adjusting material layer is selected from a rare earth metal-containing material and an alkaline earth metal-containing material.

16. The semiconductor structure of claim 15 wherein said rare earth metal-containing material is selected from the group consisting of an oxide of at least one element from Group IIIB of the Periodic Table of Elements and a nitride of at least one element from Group IIIB of the Periodic Table of Elements.

17. The semiconductor structure of claim 15 wherein said alkaline earth metal-containing material is comprised of a compound of the formula $MA_x$ wherein M is an alkaline earth metal, A is one of O, S and a halide, and x is 1 or 2.

18. The semiconductor structure of claim 13 wherein said dielectric material layer is selected from the group consisting of undoped silicate glass (USG), borosilicate glass (BSG), phosphosilicate glass (PSG), fluorosilicate glass (FSG), borophosphosilicate glass (BPSG), and combinations thereof.

19. The semiconductor structure of claim 13 wherein said dielectric material layer is selected from the group consisting of a silsesquioxane, a C doped oxide that includes atoms of Si, C, O and H, a thermosetting polyarylene ether, and multilayers thereof.

* * * * *